United States Patent
Hsu et al.

(10) Patent No.: US 9,627,337 B2
(45) Date of Patent: *Apr. 18, 2017

(54) INTEGRATED CIRCUIT DEVICE

(71) Applicant: Novatek Microelectronics Corp., Hsinchu (TW)

(72) Inventors: Jung-Fu Hsu, Hsinchu (TW); Tai-Hung Lin, Hsinchu (TW); Chang-Tien Tsai, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/740,286

(22) Filed: Jun. 16, 2015

(65) Prior Publication Data

US 2015/0287686 A1 Oct. 8, 2015

Related U.S. Application Data

(63) Continuation-in-part of application No. 14/666,322, filed on Mar. 24, 2015, which is a continuation of
(Continued)

(30) Foreign Application Priority Data

Mar. 31, 2011 (TW) .............................. 100111301 A

(51) Int. Cl.
- *H01L 23/60* (2006.01)
- *H01L 23/00* (2006.01)
- *H01L 27/02* (2006.01)

(52) U.S. Cl.
CPC .............. *H01L 24/06* (2013.01); *H01L 23/60* (2013.01); *H01L 24/05* (2013.01); *H01L 24/45* (2013.01);
(Continued)

(58) Field of Classification Search
None
See application file for complete search history.

(56) References Cited

U.S. PATENT DOCUMENTS 5,541,450 A * 7/1996 Jones .................. H01L 23/3128
257/697
5,646,451 A * 7/1997 Freyman ............. H01L 23/4952
228/180.5

(Continued)

FOREIGN PATENT DOCUMENTS

| CN | 1451180 | 10/2003 |
|---|---|---|
| CN | 1505140 | 6/2004 |
| CN | 2854807 | 1/2007 |

OTHER PUBLICATIONS

"Office Action of US parent Application", issued on Aug. 17, 2015, p. 1-p. 9, in which the listed references were cited.
(Continued)

*Primary Examiner* — Thao P Le
(74) *Attorney, Agent, or Firm* — Jianq Chyun IP Office

(57) ABSTRACT

An integrated circuit device including a semiconductor substrate, a first bonding pad structure, a second bonding pad structure, and an internal bonding wire is provided. The first bonding pad structure is disposed on a surface of the semiconductor substrate and exposed outside of the semiconductor substrate. The second bonding pad structure is disposed on the surface of the semiconductor substrate and exposed outside of the semiconductor substrate. The first bonding pad structure is electrically coupled to the second bonding pad structure via the internal bonding wire. The integrated circuit device having a better electrical performance is provided by eliminating internal resistance drop in power supply trails or ground trails, and improving signal integrity of the integrated circuit device.

16 Claims, 14 Drawing Sheets

Related U.S. Application Data application No. 14/062,899, filed on Oct. 25, 2013, now Pat. No. 9,041,201, which is a continuation of application No. 13/423,264, filed on Mar. 18, 2012, now Pat. No. 8,618,660.

(52) U.S. Cl.
CPC ............ *H01L 24/48* (2013.01); *H01L 24/49* (2013.01); *H01L 27/0248* (2013.01); *H01L 2224/02166* (2013.01); *H01L 2224/04042* (2013.01); *H01L 2224/05095* (2013.01); *H01L 2224/05124* (2013.01); *H01L 2224/05147* (2013.01); *H01L 2224/05553* (2013.01); *H01L 2224/05554* (2013.01); *H01L 2224/0612* (2013.01); *H01L 2224/451* (2013.01); *H01L 2224/45015* (2013.01); *H01L 2224/4813* (2013.01); *H01L 2224/48091* (2013.01); *H01L 2224/48465* (2013.01); *H01L 2224/49113* (2013.01); *H01L 2924/00014* (2013.01); *H01L 2924/01029* (2013.01); *H01L 2924/2064* (2013.01); *H01L 2924/30205* (2013.01)

(56) References Cited

U.S. PATENT DOCUMENTS

| | | | |
|---|---|---|---|
| 6,285,075 B1 * | 9/2001 | Combs | H01L 23/4334 257/675 |
| 6,329,714 B1 | 12/2001 | Guillot | |
| 6,387,730 B2 | 5/2002 | Guillot | |
| 6,590,275 B2 | 7/2003 | Fujisawa et al. | |
| 7,667,306 B1 | 2/2010 | Fan | |
| 8,546,939 B2 * | 10/2013 | Sasaki | H01L 23/66 257/197 |
| 8,618,660 B2 | 12/2013 | Lin et al. | |
| 9,041,201 B2 | 5/2015 | Lin et al. | |
| 2001/0014487 A1 | 8/2001 | Guillot | |
| 2002/0100949 A1 | 8/2002 | Kim | |
| 2006/0097374 A1 * | 5/2006 | Egawa | H01L 23/3128 257/686 |
| 2008/0050862 A1 | 2/2008 | Yano et al. | |
| 2008/0197491 A1 * | 8/2008 | Matsui | H01L 23/60 257/737 |
| 2009/0294952 A1 | 12/2009 | Lin et al. | |
| 2010/0133701 A1 | 6/2010 | Saiki et al. | |
| 2011/0079912 A1 * | 4/2011 | Marcoux | H01L 23/481 257/773 |
| 2011/0080713 A1 * | 4/2011 | Sunohara | H01L 23/147 361/760 |
| 2015/0104904 A1 * | 4/2015 | Osugi | H01L 27/0814 438/107 |
| 2015/0129874 A1 * | 5/2015 | Choi | H01L 23/552 257/48 |
| 2016/0013143 A1 * | 1/2016 | Fujii | H01L 24/48 257/762 |
| 2016/0013149 A1 * | 1/2016 | Haga | H01L 24/97 257/771 |

OTHER PUBLICATIONS

"Office Action of China Counterpart Application", issued on Nov. 30, 2016, p.1-p.6, in which the listed references were cited.

* cited by examiner

US 9,627,337 B2

1

INTEGRATED CIRCUIT DEVICE

CROSS-REFERENCE TO RELATED APPLICATION

This is a continuation-in-part application of and claims the priority benefit of U.S. application Ser. No. 14/666,322, filed on Mar. 24, 2015, now pending. The prior U.S. application Ser. No. 14/666,322 is a continuation application of and claims the priority benefit of U.S. application Ser. No. 14/062,899, filed on Oct. 25, 2013, now U.S. Pat. No. 9,041,201. The prior U.S. application Ser. No. 14/062,899 is a continuation application of and claims the priority benefit of U.S. application Ser. No. 13/423,264, filed on Mar. 18, 2012, now U.S. Pat. No. 8,618,660, which claims the priority benefit of Taiwan application serial no. 100111301, filed on Mar. 31, 2011. The entirety of each of the above-mentioned patent applications is hereby incorporated by reference herein and made a part of this specification.

BACKGROUND OF THE DISCLOSURE

Field of the Disclosure

The disclosure relates to an integrated circuit device. More particularly, the disclosure relates to an integrated circuit device in which portion of the interconnect lines are replaced by bonding wires.

Description of Related Art

Metallic interconnect is commonly used for internal electrical transmission of the integrated circuit device, wherein the connection way and the connection path is through the design conducted by the integrated circuit design process. Since the metallic interconnect is fabricated by photolithographic and etching process, all the configuration, length and width will be affected by the limitation of technology of process, and thus the electrical performance of the connection is also limited. On the other hand, wire bonding technique is commonly used to perform the electrical transmission between the terminal of the integrated circuit device and external devices. The wire bonding technique is using the metal wire produced by wire bonding process for connection. It provides a better electrical performance, and limitation to design is also reduced so as to be more flexible in design.

FIG. 11 is a front view of an integrated circuit device according to a related art of the disclosure. An integrated circuit device usually includes a semiconductor substrate 1 on which an integrated circuit is implemented and fabricated as an integrated circuit chip and a package substrate 2. The semiconductor substrate 1 may include one or more core circuit regions 3 and one or more I/O (input/output) regions 4. The circuitry of the integrated circuit chip is implemented in the core circuit regions 3, and the I/O regions 4 are arranged for transmitting primary signals and power voltages, such as the system voltages VDD and VSS (not shown) and the ground voltage of the integrated circuit chip, to the package substrate 2. There are conducting lines 6 on the package substrate 2 for conducting and stretching the primary signals and the power voltages of the integrated circuit chip to the exterior of the integrated circuit device. The connection between the integrated circuit chip and the conducting lines 6 of the package substrate 2 is via wire bonding technique as mentioned above. Therefore, bonding pads 5 are placed in the I/O regions 4 for conducting wire bonding from the bonding pads 5 to the conducting lines 6 of the package substrate 2, and bonding wires 7 are thus established therebetween. The I/O regions 4 are usually located on the edge portion of the integrated circuit chip for ease of wire bonding process.

SUMMARY OF THE DISCLOSURE

The disclosure is directed to an integrated circuit device having a better electrical performance.

The disclosure provides an integrated circuit device including a semiconductor substrate, a first bonding pad structure, a second bonding pad structure, and an internal bonding wire. The first bonding pad structure is disposed on a surface of the semiconductor substrate and exposed outside of the semiconductor substrate. The second bonding pad structure is disposed on the surface of the semiconductor substrate and exposed outside of the semiconductor substrate. The first bonding pad structure is electrically coupled to the second bonding pad structure via the internal bonding wire.

In an exemplary embodiment of the disclosure, the integrated circuit device further includes an external bonding wire. The second bonding pad structure is electrically coupled to a package lead via the external bonding wire.

In an exemplary embodiment of the disclosure, the second bonding pad structure includes a single bonding pad. The single bonding pad includes a first bonding area and a second bonding area. The first bonding area is configured to establish the internal bonding wire between the second bonding pad structure and the first bonding pad structure. The second bonding area is electrically coupled to the first bonding area. The second bonding area is configured to establish the external bonding wire between the second bonding pad structure and the package lead.

In an exemplary embodiment of the disclosure, the first bonding area and the second bonding area are located in a same pad opening of the second bonding pad structure.

In an exemplary embodiment of the disclosure, the first bonding area and the second bonding area are respectively located in different pad openings of the second bonding pad structure.

In an exemplary embodiment of the disclosure, the semiconductor substrate includes an I/O region and a core circuit region. The second bonding pad structure includes a conducting line, a first bonding pad, and a second bonding pad. The first bonding pad is configured to establish the internal bonding wire between the second bonding pad structure and the first bonding pad structure. The second bonding pad is electrically coupled to the first bonding pad via the conducting line. The second bonding pad is configured to establish the external bonding wire between the second bonding pad structure and the package lead.

In an exemplary embodiment of the disclosure, the first bonding pad and the second bonding pad are adjacent to each other.

In an exemplary embodiment of the disclosure, the second bonding pad structure further includes at least one third bonding pad. The at least one third bonding pad is located between the first bonding pad and the second bonding pad.

In an exemplary embodiment of the disclosure, the first bonding pad is located in one of the I/O region and the core circuit region, and the second bonding pad is located in another one of the I/O region and the core circuit region.

In an exemplary embodiment of the disclosure, both of the first bonding pad and the second bonding pad are located in one of the I/O region and the core circuit region.

In an exemplary embodiment of the disclosure, the semiconductor substrate includes an I/O region and a core circuit region. The first bonding pad structure is located in one of the I/O region and the core circuit region. The second bonding pad structure is located in another one of the I/O region and the core circuit region.

In an exemplary embodiment of the disclosure, the integrated circuit device further includes a circuit electrically coupled to the first bonding pad structure.

In an exemplary embodiment of the disclosure, a power voltage applied to the circuit is transmitted from the second bonding pad structure to the circuit via the internal bonding wire and the first bonding pad structure.

In an exemplary embodiment of the disclosure, the power voltage is selected from one of a ground voltage, a first power voltage, and a second power voltage. The first power voltage having a voltage level greater than the ground voltage, and the second power voltage having a voltage level less than the ground voltage.

In an exemplary embodiment of the disclosure, a signal coupled to the circuit is transmitted between the circuit and the second bonding pad structure via the internal bonding wire and the first bonding pad structure.

In an exemplary embodiment of the disclosure, the integrated circuit device further includes an electrostatic discharge protection circuit. The electrostatic discharge protection circuit is electrically coupled to the second bonding pad structure.

The disclosure provides an integrated circuit device including a semiconductor substrate, a first bonding pad structure, a second bonding pad structure, a third bonding pad structure, a first internal bonding wire, and a second internal bonding wire. The first bonding pad structure is disposed on a surface of the semiconductor substrate and exposed outside of the semiconductor substrate. The second bonding pad structure is disposed on the surface of the semiconductor substrate and exposed outside of the semiconductor substrate. The third bonding pad structure is disposed on the surface of the semiconductor substrate and exposed outside of the semiconductor substrate. The first bonding pad structure is electrically coupled to the third bonding pad structure via the first internal bonding wire. The third bonding pad structure is electrically coupled to the second bonding pad structure via the second internal bonding wire.

In an exemplary embodiment of the disclosure, the integrated circuit device further includes an external bonding wire. The second bonding pad structure is electrically coupled to a package lead via the external bonding wire.

In an exemplary embodiment of the disclosure, the second bonding pad structure includes a first single bonding pad. The first single bonding pad includes a first bonding area and a second bonding area. The first bonding area is configured to establish the second internal bonding wire between the second bonding pad structure and the third bonding pad structure. The second bonding area is electrically coupled to the first bonding area. The second bonding area is configured to establish the external bonding wire between the second bonding pad structure and the package lead.

In an exemplary embodiment of the disclosure, the first bonding area and the second bonding area are located in a same pad opening of the second bonding pad structure.

In an exemplary embodiment of the disclosure, the first bonding area and the second bonding area are respectively located in different pad openings of the second bonding pad structure.

In an exemplary embodiment of the disclosure, the semiconductor substrate includes an I/O region and a core circuit region. The second bonding pad structure includes a first conducting line, a first bonding pad, and a second bonding pad. The first bonding pad is configured to establish the second internal bonding wire between the second bonding pad structure and the third bonding pad structure. The second bonding pad is electrically coupled to the first bonding pad via the first conducting line. The second bonding pad is configured to establish the external bonding wire between the second bonding pad structure and the package lead.

In an exemplary embodiment of the disclosure, the first bonding pad and the second bonding pad are adjacent to each other.

In an exemplary embodiment of the disclosure, the second bonding pad structure further includes at least one third bonding pad. The at least one third bonding pad is located between the first bonding pad and the second bonding pad.

In an exemplary embodiment of the disclosure, the first bonding pad is located in one of the I/O region and the core circuit region, and the second bonding pad is located in another one of the I/O region and the core circuit region.

In an exemplary embodiment of the disclosure, both of the first bonding pad and the second bonding pad are located in one of the I/O region and the core circuit region.

In an exemplary embodiment of the disclosure, the third bonding pad structure includes a second single bonding pad. The second single bonding pad includes a third bonding area and a fourth bonding area. The third bonding area is configured to establish the first internal bonding wire between the third bonding pad structure and the first bonding pad structure. The fourth bonding area is electrically coupled to the third bonding area. The fourth bonding area is configured to establish the second internal bonding wire between the third bonding pad structure and the second bonding pad structure.

In an exemplary embodiment of the disclosure, the third bonding area and the fourth bonding area are located in a same pad opening of the third bonding pad structure.

In an exemplary embodiment of the disclosure, the third bonding area and the fourth bonding area are respectively located in different pad openings of the third bonding pad structure.

In an exemplary embodiment of the disclosure, the semiconductor substrate includes an I/O region and a core circuit region. The third bonding pad structure includes a second conducting line, a fourth bonding pad, and a fifth bonding pad. The fourth bonding pad is configured to establish the first internal bonding wire between the third bonding pad structure and the first bonding pad structure. The fifth bonding pad is electrically coupled to the fourth bonding pad via the second conducting line. The fifth bonding pad is configured to establish the second internal bonding wire between the third bonding pad structure and the second bonding pad structure.

In an exemplary embodiment of the disclosure, the fourth bonding pad and the fifth bonding pad are adjacent to each other.

In an exemplary embodiment of the disclosure, the third bonding pad structure further includes at least one sixth pad. The at least one sixth pad is located between the fourth bonding pad and the fifth bonding pad.

In an exemplary embodiment of the disclosure, the fourth bonding pad is located in one of the I/O region and the core circuit region, and the fifth bonding pad is located in another one of the I/O region and the core circuit region.

In an exemplary embodiment of the disclosure, both of the fourth bonding pad and the fifth bonding pad are located in one of the I/O region and the core circuit region.

In an exemplary embodiment of the disclosure, the semiconductor substrate includes an I/O region and a core circuit region. The first bonding pad structure is located in one of the I/O region and the core circuit region, and the second bonding pad structure is located in another one of the I/O region and the core circuit region.

In an exemplary embodiment of the disclosure, the third bonding pad structure is located in the I/O region or the core circuit region.

In an exemplary embodiment of the disclosure, the integrated circuit device further includes a circuit electrically coupled to the first bonding pad structure.

In an exemplary embodiment of the disclosure, a power voltage applied to the circuit is transmitted from the second bonding pad structure to the circuit via the second internal bonding wire, the third bonding pad structure, the first internal bonding wire, and the first bonding pad structure.

In an exemplary embodiment of the disclosure, the power voltage is selected from one of a ground voltage, a first power voltage, and a second power voltage. The first power voltage having a voltage level greater than the ground voltage, and the second power voltage having a voltage level less than the ground voltage.

In an exemplary embodiment of the disclosure, a signal coupled to the circuit is transmitted between the circuit and the second bonding pad structure via the second internal bonding wire, the third bonding pad structure, the first internal bonding wire, and the first bonding pad structure.

In an exemplary embodiment of the disclosure, the integrated circuit device further includes an electrostatic discharge protection circuit. The electrostatic discharge protection circuit is electrically coupled to the second bonding pad structure.

Based on the above, in exemplary embodiments of the disclosure, the integrated circuit device has a better electrical performance by eliminating internal resistance drop (IR-drop) in power supply trails or ground trails, and improving signal integrity of the integrated circuit device. The disclosure also provides an easy way of building conduction paths among circuitry of the integrated circuit device, particularly for a very large scale integrated circuit device of high circuit complexity.

BRIEF DESCRIPTION OF THE DRAWINGS

The accompanying drawings constituting a part of this specification are incorporated herein to provide a further understanding of the disclosure. Here, the drawings illustrate embodiments of the disclosure and, together with the description, serve to explain the principles of the disclosure.

DESCRIPTION OF EMBODIMENTS

Figure 1:
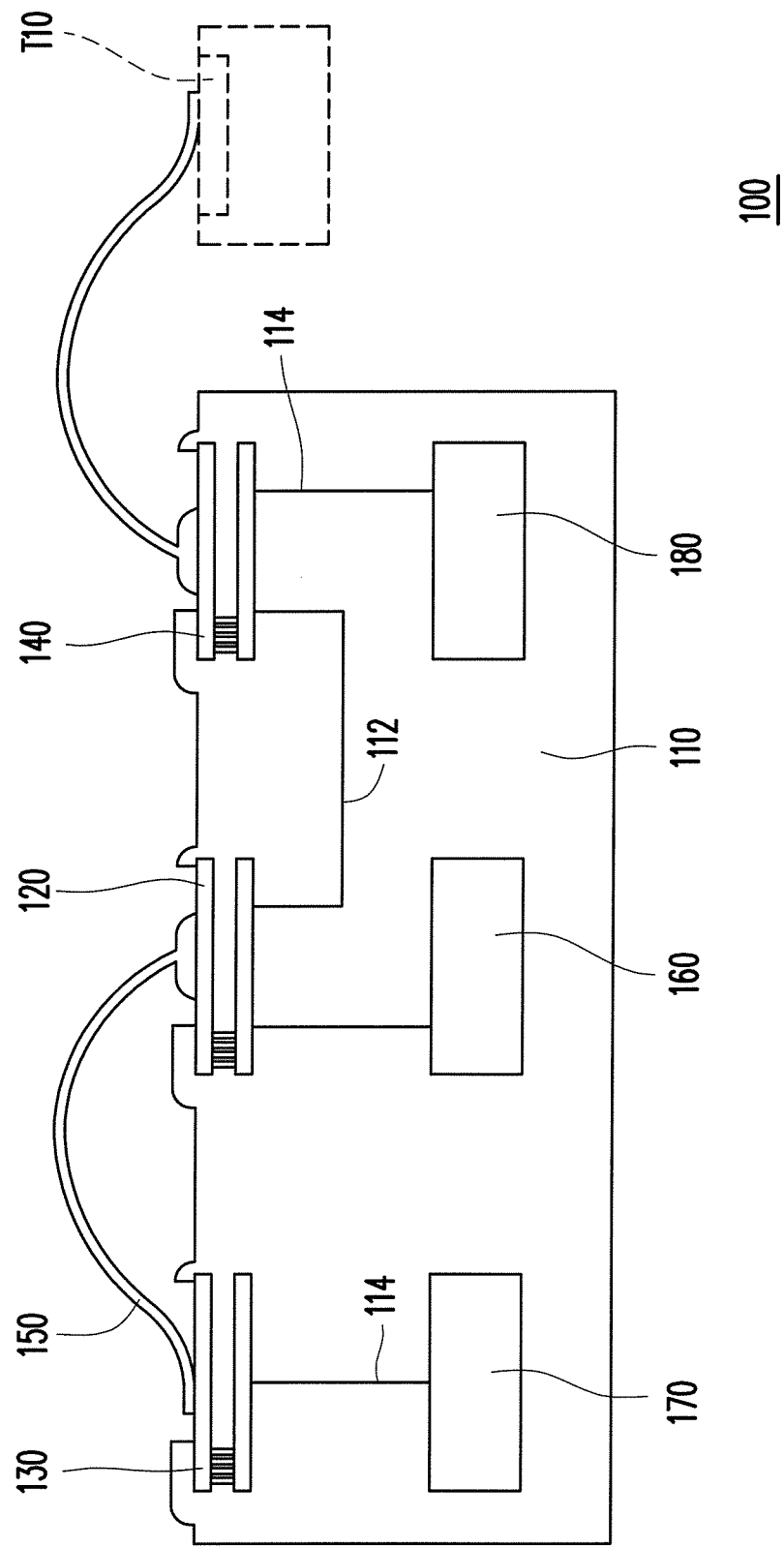
FIG. 1 is a schematic cross-sectional view of an integrated circuit device according to one embodiment of the disclosure.

FIG. 1 is a schematic cross-sectional view of an integrated circuit device according to one embodiment of the disclosure. Please refer to FIG. 1. The integrated circuit device 100 of disclosure includes a semiconductor substrate 110, a first internal bonding pad 120, a second internal bonding pad 130, an external bonding pad 140 and a bonding wire 150. A first circuit 160, a second circuit 170, at least one interconnect line 112 and an electrostatic discharge protection (ESD) circuit 180 are embedded in the semiconductor substrate 110. In the exemplary embodiment, the semiconductor substrate 110 may further include a plurality of interconnect lines 114. The first internal bonding pad 120 is disposed on a surface of the semiconductor substrate 110 and electrically coupled to the first circuit 160. The second internal bonding pad 130 is disposed on the surface of the semiconductor substrate 110 and electrically coupled to the second circuit 170. The external bonding pad 140 is disposed on the surface of the semiconductor substrate 110. The first internal bonding pad 120 is electrically coupled to the second internal bonding pad 130 through the bonding wire 150. The first internal bonding pad 120 is electrically coupled to the external bonding pad 140 through the interconnect line 112. The electrostatic discharge protection circuit 180 is electrically coupled to the external bonding pad 140. The external bonding pad 140 is used for electrically coupling to an external package lead T10.

In the integrated circuit device 100 of the embodiment, the first circuit 160 and the second circuit 170 located within the semiconductor substrate 110 not only may use the path of the interconnect line for signal transmission, but also may use the paths of the first internal bonding pad 120, the bonding wire 150 and the second internal bonding pad 130 for signal transmission. The bonding wire 150 is the metal wire fabricated by the wire bonding process and located outside of the semiconductor substrate 110. The diameter of the bonding wire 150 is greater than the width of the interconnect line. Hence, the resistance of the bonding wire 150 is comparatively smaller and may obtain a better electrical performance. In addition, by using the bonding wire 150 for signal transmission between the first circuit 160 and the second circuit 170, inconvenience or disadvantage which may be caused from the using of the interconnect line for signal transmission within the semiconductor substrate 110 may be avoided. Since the forming of the required number of metal layers may be reduced, the required number of masks to form the interconnect line may be also minimized. Thus, the required time for designing the integrated circuit device 100 is quite substantially decreased.

In the integrated circuit device 100 of the embodiment, the electrostatic discharge protection circuit 180 that associates to the external bonding pad may avoid the damage of the first circuit 160 and the second circuit 170 due to the electrostatic discharge energy come from the external package lead T10.

For instance, the first circuit 160 of the embodiment may be a logic circuit, a digital circuit, a memory circuit or other circuits. The second circuit 170 may also be a logic circuit, a digital circuit, a memory circuit or other circuits.

Figure 2:
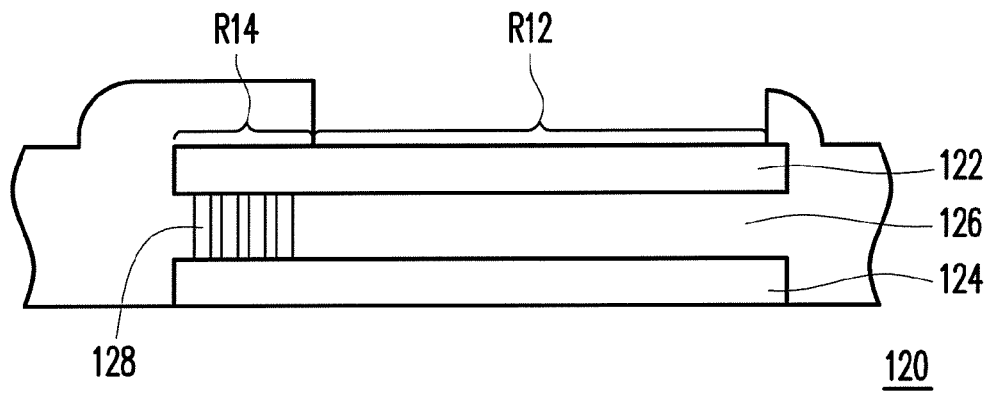
FIG. 2 is a schematic cross-sectional view of the first internal bonding pad of FIG. 1.
Figure 3:
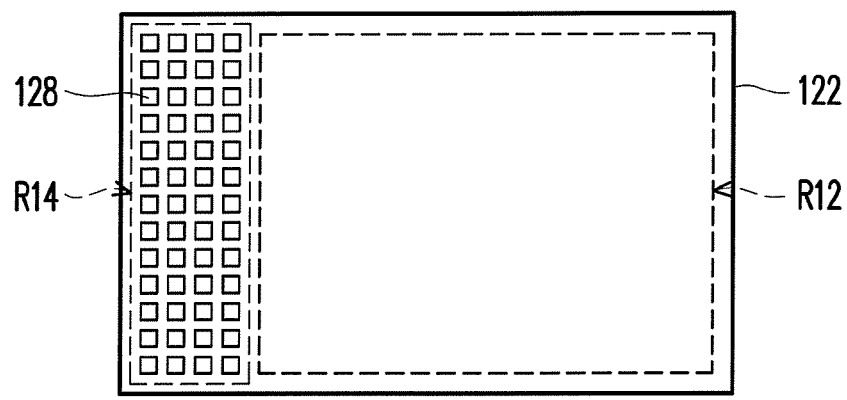
FIG. 3 and FIG. 4 are front views of two metal pads of FIG. 2, respectively.
Figure 4:
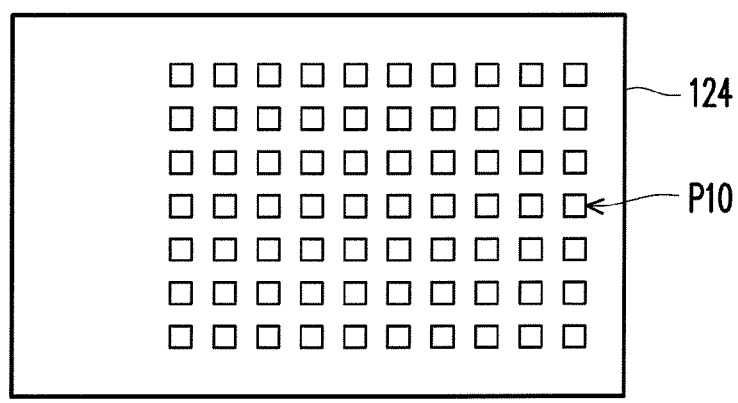

FIG. 2 is a schematic cross-sectional view of the first internal bonding pad of FIG. 1 and FIG. 3 and FIG. 4 are front views of two metal pads of FIG. 2, respectively. Please refer to FIG. 2. In this embodiment, the first internal bonding pad 120 includes a first metal pad 122, a second metal pad 124 and a dielectric layer 126. The first metal pad 122 is electrically coupled to the second metal pad 124. The dielectric layer 126 is located between the first metal pad 122 and the second metal pad 124. Since a double metal pad layers structure is used to form the first internal bonding pad 120, the impact of wire bonding which may affect the structure below the first internal bonding pad 120 may be reduced during the wire bonding process. Thus, a circuit may be configured below the first internal bonding pad 120 and it is helpful to minimize the size of the whole integrated circuit device.

Referring FIG. 2 and FIG. 3, the first metal pad 122 has wire bonding area R12 and a conductive area R14, for example. The first internal bonding pad 120 further includes a plurality of conductive elements 128 passing through the dielectric layer 126 and coupling the conductive area R14 of the first metal pad 122 to the second metal pad 124. The conductive area R14 is located at a side of the wire bonding area R12. The wire bonding area R12 is to sustain the impact during the follow-up wire bonding process. The design of the conductive element 128 not being configured in the wire bonding area R12 may improve the impact endurance of the first internal bonding pad 120. Referring FIG. 2 and FIG. 4, the second metal pad 124 has a plurality of openings P10 (merely shown in FIG. 4), located below the wire bonding area R12. The openings P10 may also improve the impact endurance of the first internal bonding pad 120. Additionally, the wire bonding area R12 of the first metal bonding pad 122 maintains the completeness and the largest contact area with the bonding wire to improve the electrical performance. According to the above mentioned configuration, the first internal bonding pad 120 may have elasticity and may reduce the stress effect exerting on the first internal bonding pad 120 during the wire bonding process, so as to configure a circuit below the first internal bonding pad 120. Referring to FIG. 2, the material of the first metal pad 122 and the second metal pad 124 is copper, for example. Or the material of the first metal pad 122 is aluminum and the material of the second metal pad 124 is copper, for example.

Although the structure of the bonding pad has exemplarily been disclosed in FIG. 2, the disclosure is not limited thereto. The structure of the bonding pad of the disclosure may be implemented as other structures.

Figure 5:
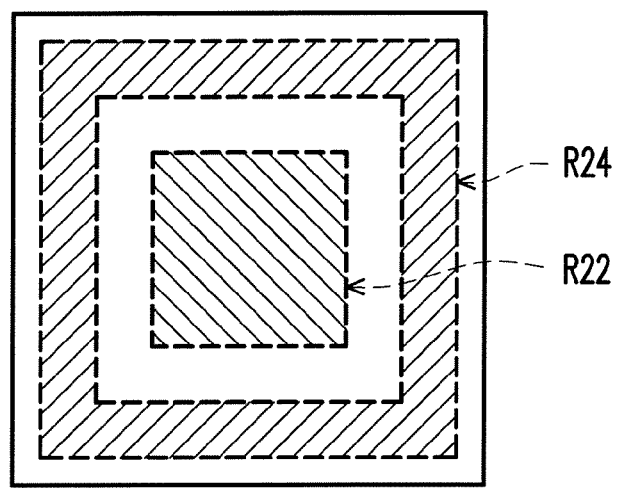
FIG. 5 is a front view of a first metal pad of a first internal bonding pad according to another embodiment.

FIG. 5 is a front view of a first metal pad of a first internal bonding pad according to another embodiment. Referring FIG. 5, in the embodiment, the conductive area R24 of the first metal pad 122 surrounds the wire bonding area R22. Certainly, the corresponding locations of the conductive area R24 and the wire bonding area R22 may also be in other suitable configurations.

Please refer to FIG. 1. The second internal bonding pad 130 and the external bonding pad 140 may also use the structure similar to the first internal bonding pad 120. That is, in order to improve the impact endurance of the second internal bonding pad 130 and the external bonding pad 140, they may be configured by the double layers of the metal pads and the dielectric layer between thereof.

Figure 6:
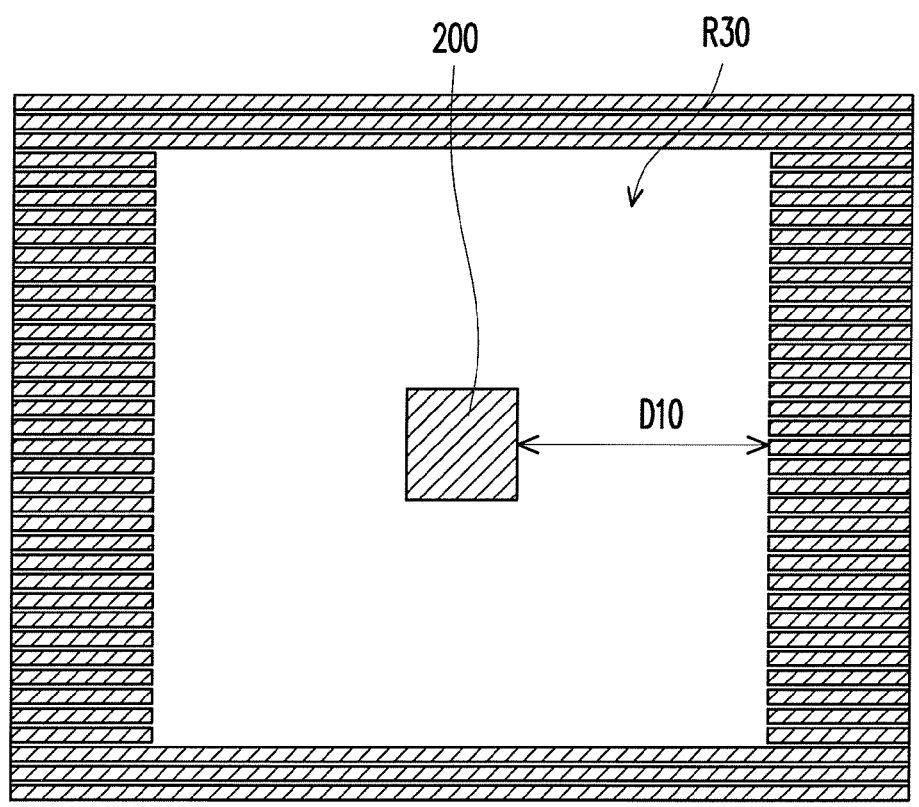
FIG. 6 illustrates a portion of the surface of the semiconductor substrate of another embodiment of the disclosure.

FIG. 6 illustrates a portion of the surface of the semiconductor substrate of another embodiment of the disclosure. Referring FIG. 6, in the embodiment, the surface of the semiconductor substrate has a non-circuit area R30 surrounding the external bonding pad 200. The distance D10 between the external periphery of the non-circuit area R30 and the external periphery of the external bonding pad 200 is 2 μm to 50 μm. The preferable distance D10 between the external periphery of the non-circuit area R30 and the external periphery of the external bonding pad 200 is 10 μm. The non-circuit area R30 may avoid the damage of the circuit wire due to the impact during the wire bonding process. Similarly, a non-circuit area may also be disposed at the external periphery of the internal bonding pad of the foregoing embodiment.

Figure 7:
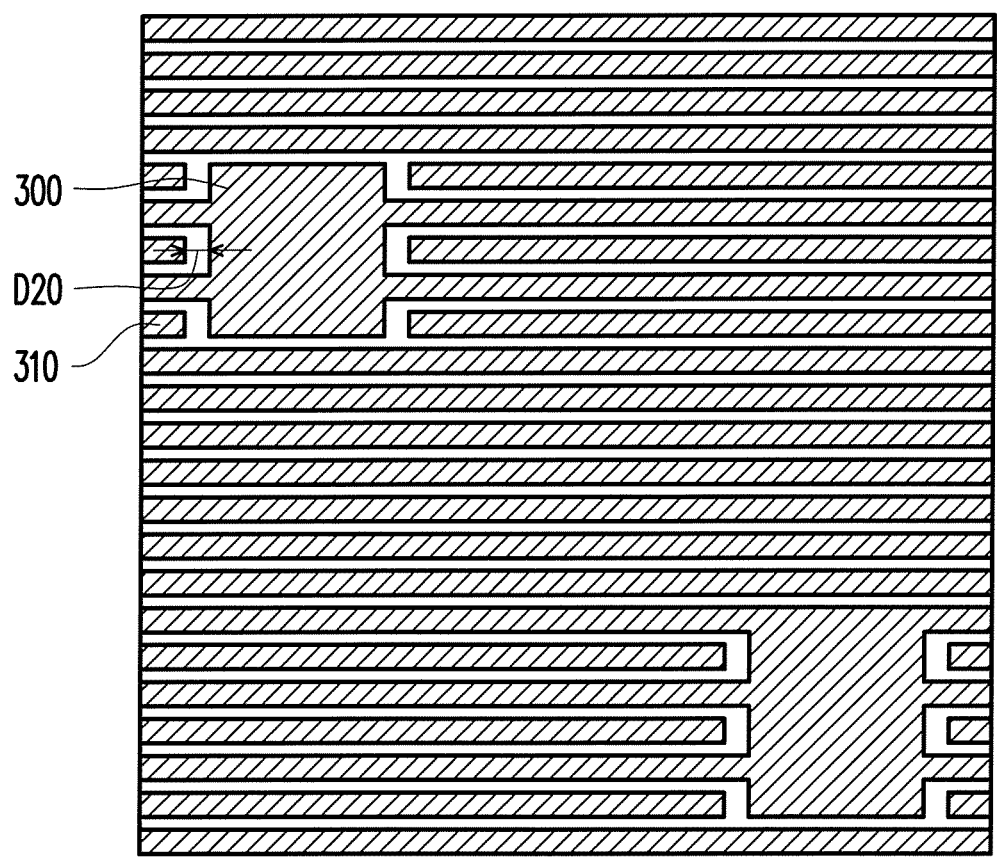
FIG. 7 illustrates an external bonding pad and the configuration of a peripheral circuit thereof according to the first embodiment of the disclosure.

FIG. 7 illustrates an external bonding pad and the configuration of a peripheral circuit thereof according to the first embodiment of the disclosure. Please refer to FIG. 6 and FIG. 7. FIG. 6 is described with the case of the external bonding pad 200 located at the outer most surface of the semiconductor substrate. However, the external bonding pad may also use the configuration of the double layers of metal pads as described in FIG. 2 of the embodiment. When the external bonding pad uses the design of the double layers of metal pads, the correlation between the lower layer metal pad 300 and the surrounding circuit is as shown in FIG. 7. That is, the lower layer metal pad 300 in FIG. 7 is merely equivalent to the second metal pad 124 in FIG. 2, and the upper layer metal pad located upon the lower layer metal pad 300 is equivalent to the first metal pad 122 in FIG. 2. However, the main point of FIG. 7 is to illustrate the correlation between the lower layer metal pad 300 and the other circuit of the same layer, and hence the upper layer metal pad is not shown hereby. A transversely and longitudinally interlacing metal mesh 310 is usually formed at the metal layer in which the lower layer metal pad 300 exists. Ground mesh or power mesh is commonly seen. When these meshes meet the lower layer metal pad 300, they should be cut off and keep a distance D20 with the lower layer metal pad 300 unless they have to couple with the lower layer metal pad 300. The distance D20 is between 0.5 μm to 10 μm, and the preferable distance D20 is 2 μm.

Figure 8A:
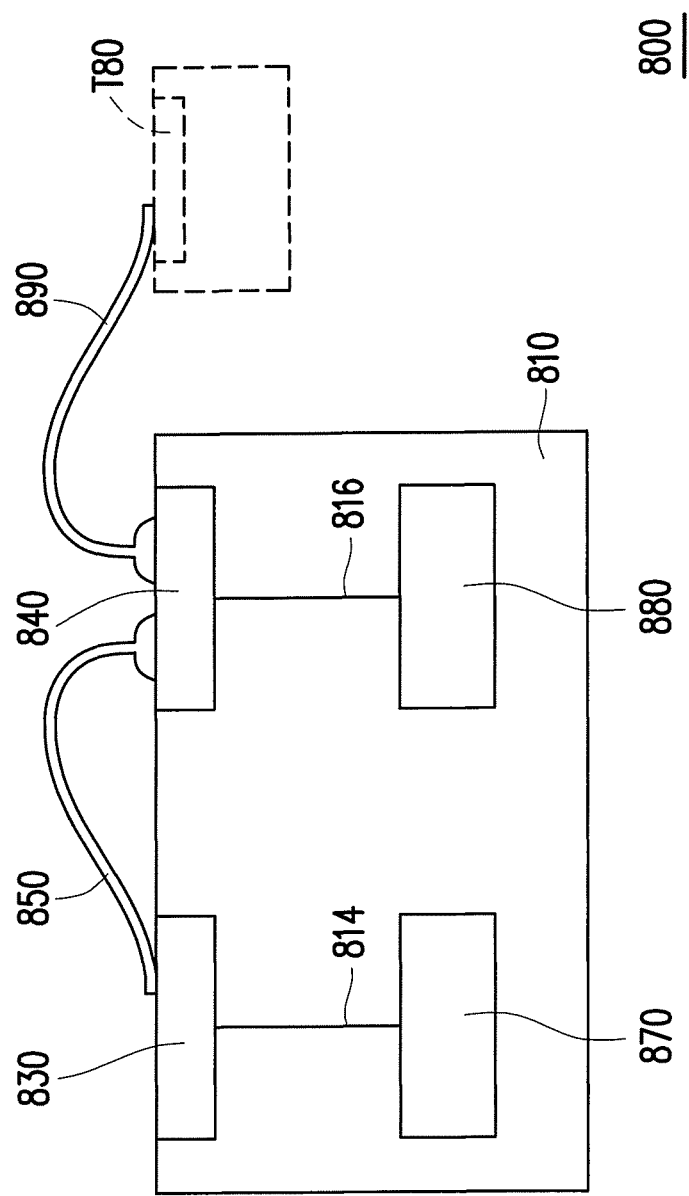
FIG. 8A is a schematic cross-sectional view of an integrated circuit device according to another embodiment of the disclosure.

FIG. 8A is a schematic cross-sectional view of an integrated circuit device according to another embodiment of the disclosure. Please refer to FIG. 8A. The integrated circuit device 800 includes a semiconductor substrate 810 that an internal bonding pad structure 830 and an external bonding pad structure 840 are disposed. The semiconductor substrate 810 that an integrated circuit is implemented and fabricated as an integrated circuit chip may also include a circuit 870 and an ESD device 880. In this embodiment, the internal bonding pad structure 830 may be located in one of the I/O region and the core circuit region, and the external bonding pad structure 840 may be located in another one of the I/O region and the core circuit region. For example, the internal bonding pad structure 830 may be located in the core circuit region, and the external bonding pad structure 840 may be located in the I/O region, but the disclosure is not limited thereto.

In this embodiment, the internal bonding pad structure 830 may connect to the circuit 870 via an interconnect line 814. The external bonding pad structure 840 may connect to the ESD device 880 via an interconnect line 816. The internal bonding pad structure 830 is connected to the external bonding pad structure 840 via a bonding wire 850, i.e. an internal bonding wire. The external bonding pad structure 840 is connected to a package lead T80 via another bonding wire 890, i.e. an external bonding wire. In this embodiment, the external bonding pad structure 840 may be located in the I/O region of the integrated circuit chip, while the internal bonding pad structure 830 may be located in the core circuit region of the integrated circuit chip.

For signal transmission, power voltages, ground voltages, and any other electrical signals (not shown) in this embodiment may be transmitted between the circuit 870 and the exterior of the integrated circuit device 800 via the package lead T80, the bonding wires 850 and 890, the external bonding pad structure 840, and the internal bonding pad structure 830. For example, a power or ground voltage applied to the circuit 870 may be transmitted from the external bonding pad structure 840 to the circuit 870 via the bonding wire 850 and the internal bonding pad structure 830. The power voltage may be selected from one of the first power voltage and the second power voltage. The first power voltage, e.g. a positive system voltage, having a voltage level greater than the ground voltage, and the second power voltage e.g. a negative system voltage, having a voltage level less than the ground voltage. Furthermore, the signal coupled to the circuit 870 may be transmitted between the circuit 870 and the external bonding pad structure 840 via the bonding wire 850 and the internal bonding pad structure 830.

Figure 8B:
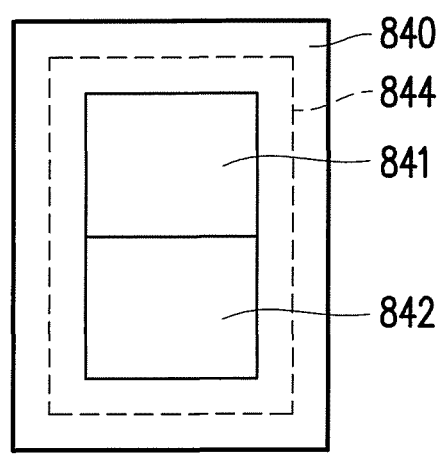
FIG. 8B is a schematic top view of the external bonding pad structure according to one embodiment of the disclosure.

FIG. 8B is a schematic top view of the external bonding pad structure according to one embodiment of the disclosure. Referring to FIG. 8A and FIG. 8B, the external bonding pad structure 840 of the exemplary embodiment may be a single bonding pad and include two bonding areas 841 and 842 which are electrically connected and are located on a pad open 844 inside the external bonding pad structure 840. The pad open 844 may coincide in position with and equal in size to the external bonding pad structure 840, but the disclosure is not limited thereto. The bonding areas 841 and 842 in the pad open 844 is required to sustain a bonding rule of the semiconductor assembly process which is employed to fabricate the integrated circuit device 800. One of the two bonding areas 841 and 842 is used to establish the bonding wire 850 for connecting the external bonding pad structure 840 to the internal bonding pad structure 830, while the other bonding area of the two bonding areas 841 and 842 is used to establish the bonding wire 890 for connecting the external bonding pad structure 840 to the package lead T80.

In this embodiment, the two bonding areas 841 and 842 are located in the same pad opening 844, but the disclosure is not limited thereto. In other embodiments, the two bonding areas 841 and 842 may be respectively located in different pad openings.

Other features of the internal bonding pad structure and the external bonding pad structure are essentially similar to that disclosed in FIG. 2 to FIG. 7, and are sufficiently taught, suggested, and embodied in the embodiments illustrated in FIG. 2 to FIG. 7. Therefore, no further description is provided herein.

Figure 9A:
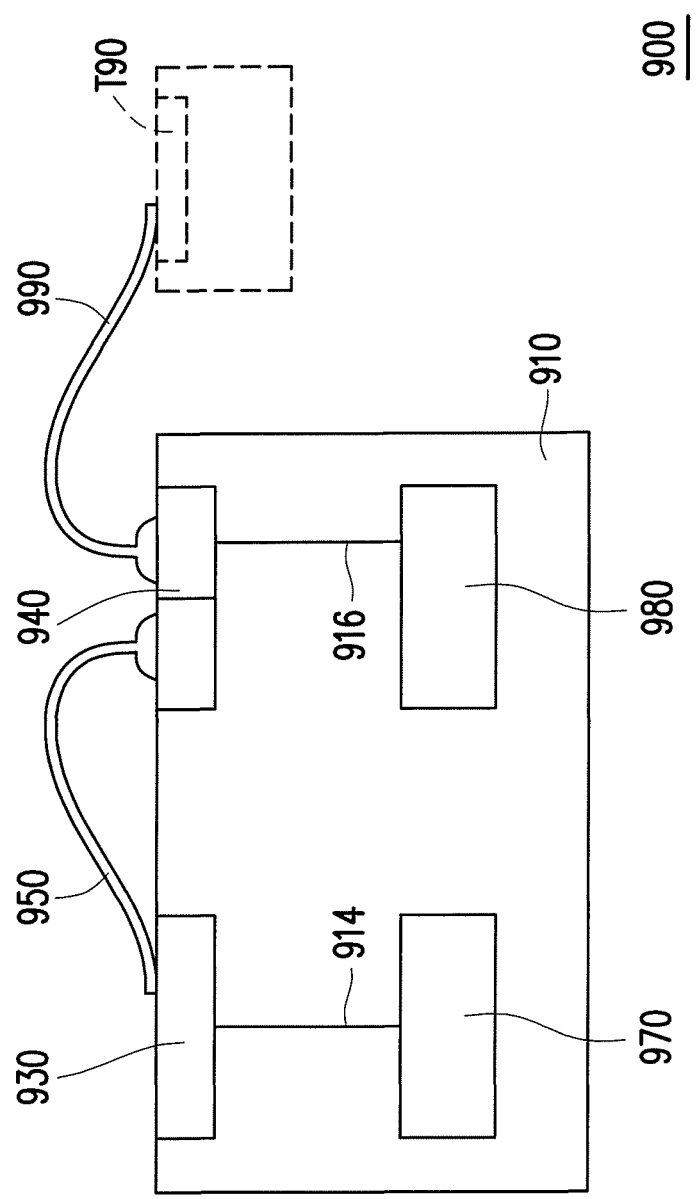
FIG. 9A is a schematic cross-sectional view of an integrated circuit device according to another embodiment of the disclosure.

FIG. 9A is a schematic cross-sectional view of an integrated circuit device according to another embodiment of the disclosure. Referring to FIGS. 8A and 9A, the integrated circuit device 900 of the exemplary embodiment is similar to the integrated circuit device 800, and the main difference therebetween, for example, lies in that the external bonding pad structure 940 may include a set of external bonding pads.

Figure 9B:
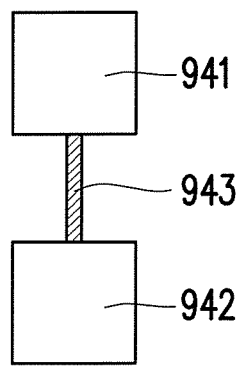
FIG. 9B is a schematic top view of the external bonding pad structure according to another embodiment of the disclosure.

To be specific, the integrated circuit device 900 includes a semiconductor substrate 910 that an internal bonding pad structure 930 and an external bonding pad structure 940 are disposed. In this embodiment, the external bonding pad structure 940 may include a set of external bonding pads, e.g. two bonding pads 941 and 942 as shown in FIG. 9B. The semiconductor substrate 910 that an integrated circuit is implemented and fabricated as an integrated circuit chip may also include a circuit 970 and an ESD device 980. The internal bonding pad structure 930 may connect to the circuit 970 via an interconnect line 914. The external bonding pad structure 940 may connect to the ESD device 980 via an interconnect line 916. The internal bonding pad structure 930 is connected to the external bonding pad structure 940 via a bonding wire 950. The external bonding pad structure 940 is connected to a package lead T90 via another bonding wire 990. Power voltages, ground voltages, and any other electrical signals may be transmitted over the package lead T90, the bonding wires 950 and 990, the external bonding pad structure 940, and the internal bonding pad structure 930 between the circuit 970 and the exterior of the integrated circuit device 900. In this embodiment, the internal bonding pad structure 930 may be located in the core circuit region of the integrated circuit chip, while the external bonding pad structure 940 may have different location alternatively.

FIG. 9B is a schematic top view of the external bonding pad structure according to another embodiment of the disclosure. Referring to FIG. 9A and FIG. 9B, the external bonding pad structure 940 includes a first bonding pad 941 and a second bonding pad 942, and both are connected via a conducting line 943. One of the bonding pads, i.e. the first bonding pad 941, is used to establish the bonding wire 950 for connecting the internal bonding pad structure 930 to the external bonding pad structure 940, while the other bonding pad, i.e. the second bonding pad 942, of the bonding pads is used to establish the bonding wire 990 for connecting the external bonding pad structure 940 to the package lead T90. Both of the bonding pads 941 and 942 may be placed immediately adjacent to each other in the I/O region of the integrated circuit chip without other bonding pads inserted therebetween. That is to say, the first bonding pad 941 and the second bonding pad 942 are adjacent to each other. Alternatively, the first bonding pad 941 and the second bonding pad 942 may be placed in different JO regions (that is, the first bonding pad 941 is placed in one of the I/O regions while the second bonding pad 942 is placed in another of the I/O regions) as long as both are electrically connected together. In this embodiment, both of the first bonding pad 941 and the second bonding pad 942 are located in the corresponding I/O region, but the disclosure is not limited thereto. In other embodiments, both of the first bonding pad 941 and the second bonding pad 942 may be located in the core circuit region. Alternatively, the first bonding pad 941 may be located in one of the I/O region and the core circuit region, while the second bonding pad 942 may be located in another one of the I/O region and the core circuit region.

Figure 9C:
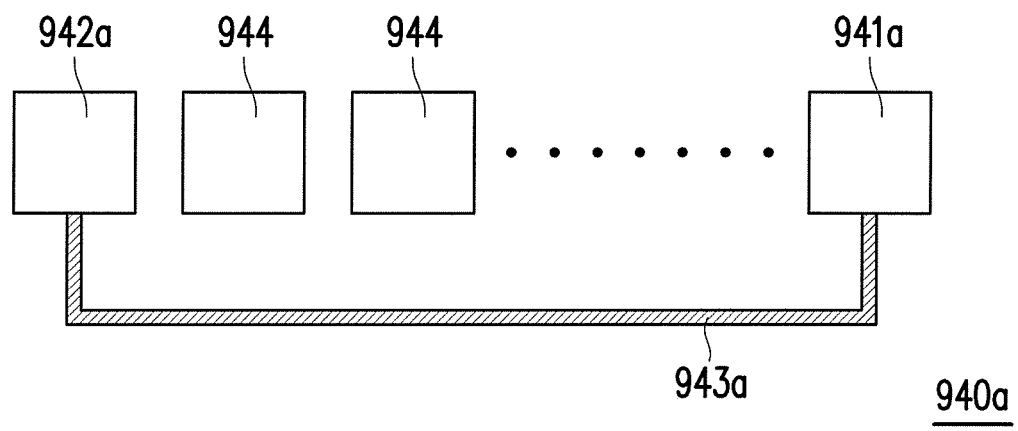
FIG. 9C is a schematic top view of the external bonding pad structure according to another embodiment of the disclosure.

FIG. 9C is a schematic top view of the external bonding pad structure according to another embodiment of the disclosure. Referring to FIGS. 9A and 9C, the external bonding pad structure 940a includes a first bonding pad 941a and a second bonding pad 942a, and both are connected via a conducting line 943a. One of the bonding pads, i.e. the first bonding pad 941a, is used to establish the bonding wire 950 for connecting the internal bonding pad structure 930 to the external bonding pad structure 940a, while the other bonding pad, i.e. the second bonding pad 942a, of the external bonding pad structure 940a is used to establish the bonding wire 990 for connecting the external bonding pad structure 940a to the package lead T90. In this embodiment, the arrangement of both bonding pads 941a and 942a is not necessary to be immediately adjacent to each other. For example, the external bonding pad structure 940a may further include at least one bonding pad 944. That is, inserting other bonding pads 944 between the bonding pads 941a and 942a are allowable as long as both the bonding pads 941a and 942a are electrically connected, for example, via the conducting line 943a in this embodiment. This arrangement is practically applied in an I/O region of the integrated circuit chip that bonding pads are placed in the edge portion of the integrated circuit chip.

Figure 9D:
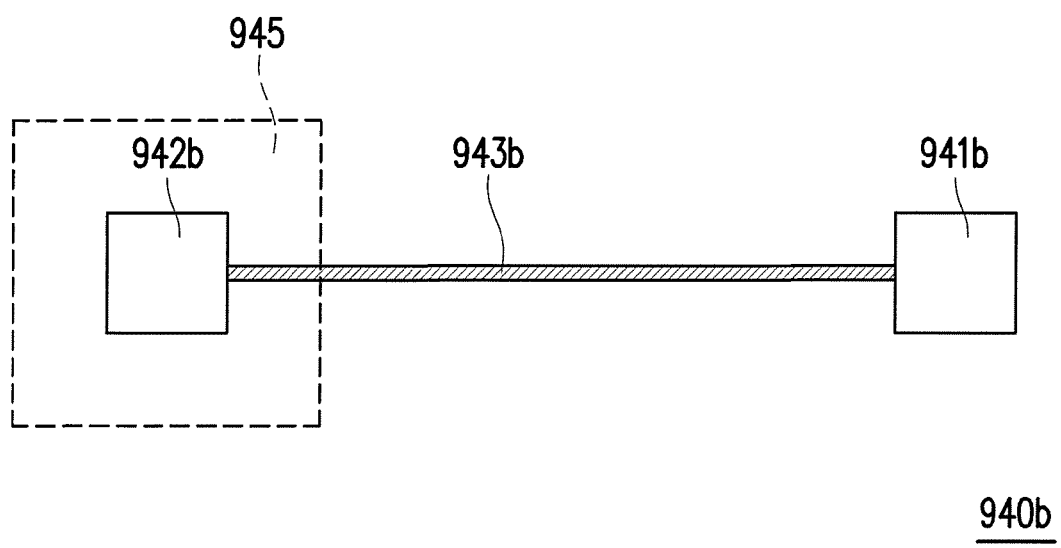
FIG. 9D is a schematic top view of the external bonding pad structure according to another embodiment of the disclosure.

FIG. 9D is a schematic top view of the external bonding pad structure according to another embodiment of the disclosure. Referring to FIGS. 9A and 9D, two bonding pads 941b and 942b of the external bonding pad structure 940 are placed apart and connected to each other with a conducting line 943b. The bonding pad 942b is used to establish the bonding wire 950 for connecting the internal bonding pad structure 930 to the external bonding pad structure 940b, while the bonding pad 941b is used to establish the bonding wire 990 for connecting the external bonding pad structure 940b to the package lead T90. In this embodiment, the bonding pad 942b is located in a core circuit region 945 while the bonding pad 941b is located in an I/O region of the integrated circuit chip for ease of establishing the wire bonding.

Other features of the internal bonding pad structure and the external bonding pad structure are essentially similar to that disclosed in FIG. 2 to FIG. 8B, and are sufficiently taught, suggested, and embodied in the embodiments illustrated in FIG. 2 to FIG. 8B. Therefore, no further description is provided herein.

FIG. 10A to FIG. 10D respectively illustrate schematic cross-sectional views of integrated circuit devices according to exemplary embodiments of the disclosure. FIG. 10A to FIG. 10D each introduces a bridging bonding pad structure 12, 22 or 42 between the internal bonding pad structure 13 and the external bonding pad structure 14, 34 or 44 for establishing bonding wires 15 and 16 to the internal bonding pad structure 13 and the external bonding pad structure 14, 34 or 44 respectively, so as to electrically connect the internal bonding pad structure 13 and the external bonding pad structure 14, 34 or 44 together. As such, power voltages, ground voltages, or other signals may transmit between the circuitry in the core circuit regions to the exterior of the integrated circuit device via the internal bonding pad structure 13, the bridging bonding pad structure 12, 22 or 42, the external bonding pad structure 14, 34 or 44 and the corresponding bonding wires 15 and 16.

Figure 10A:
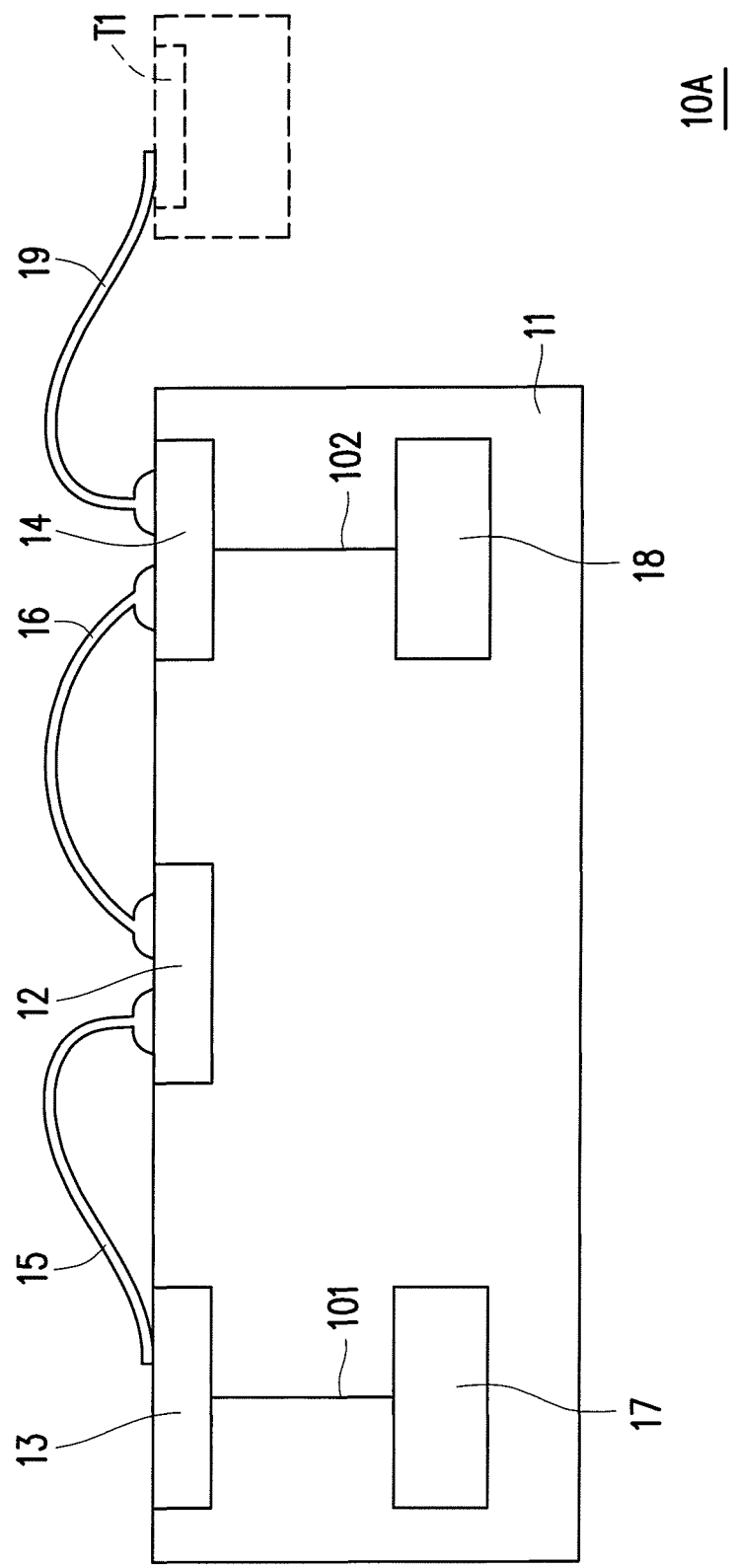
FIG. 10A to FIG. 10D respectively illustrate schematic cross-sectional views of integrated circuit devices according to exemplary embodiments of the disclosure.

FIG. 10A is a schematic cross-sectional views of an integrated circuit device according to another embodiment of the disclosure. Referring to FIGS. 8A and 10A, the integrated circuit device 10A of the exemplary embodiment is similar to the integrated circuit device 800 as shown in FIG. 8A, and the main difference therebetween, for example, lies in that the integrated circuit device 10A may further include a bridging bonding pad 12.

To be specific, the integrated circuit device 10A has a semiconductor substrate 11 that an internal bonding pad structure 13, an external bonding pad structure 14 and a bridging bonding pad structure 12 are disposed. The semiconductor substrate 11 may also include a circuit 17 and an ESD device 18. The internal bonding pad structure 13 may connect to the circuit 17 via an interconnect line 101. The external bonding pad structure 14 may connect to the ESD device 18 via an interconnect line 102. The internal bonding pad structure 13 is connected to the bridging bonding pad structure 12 via a bonding wire 15. The external bonding pad structure 14 is connected to the bridging bonding pad structure 12 via a bonding wire 16, and connected to a package lead T1 via a bonding wire 19. The bridging bonding pad structure 12 and the external bonding pad structure 14 have a similar structure as that shown in FIG. 8B, so as to support the establishment of the bonding wires 15, 16, and 19. Locations of the internal bonding pad structure 13 and the external bonding pad structure 14 may follow the case of FIG. 8. Although there is no limitation about where to place the bridging bonding pad structure 12, it is more practical to place the bridging bonding pad structure 12 in a core circuit region regardless the same or different one as that the internal bonding pad structure 13 is located.

Furthermore, in this embodiment, a power or ground voltage applied to the circuit 17 is transmitted from the external bonding pad structure 14 to the circuit 17 via the bonding wires 15 and 16, the bridging bonding pad structure 12, and the internal bonding pad structure 13. A signal coupled to the circuit 17 is transmitted between the circuit 17 and the external bonding pad structure 14 via the bonding wires 15 and 16, the bridging bonding pad structure 12, and the internal bonding pad structure 13.

Figure 10B:
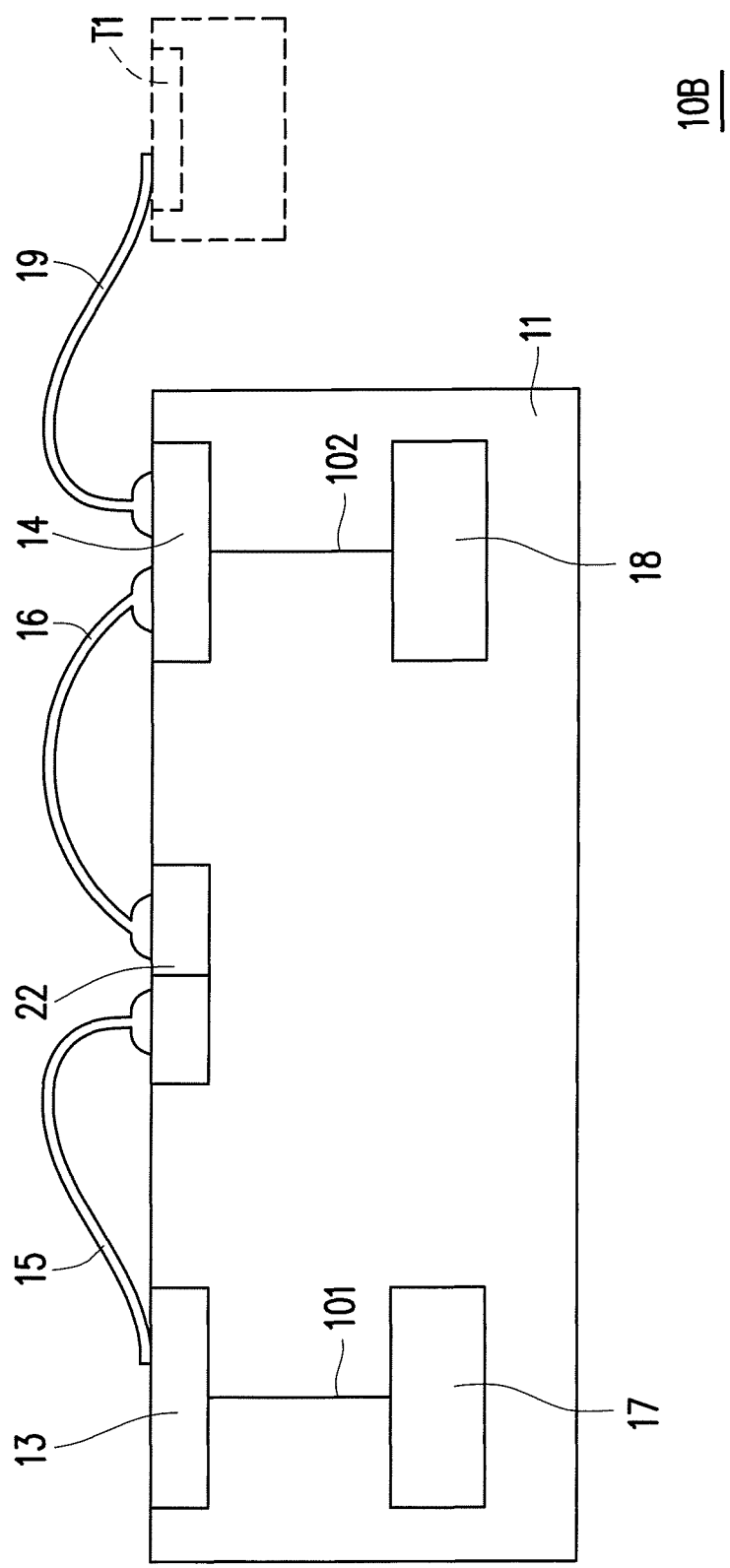

FIG. 10B is a schematic cross-sectional views of an integrated circuit device according to another embodiment of the disclosure. Referring to FIGS. 10A and 10B, the integrated circuit device 10B of the exemplary embodiment is similar to the integrated circuit device 10A as shown in FIG. 10A, and the main difference therebetween, for example, lies in that the bridging bonding pad structure 22 may include a set of bonding pads as exemplarily shown in FIG. 9B, FIG. 9C or FIG. 9D. That is to say, the integrated circuit device 10B is essentially similar to that as shown in FIG. 10A except that the bridging bonding pad structure 12 is replaced by the bridging bonding pad structure 22 including a set of bonding pads. In this embodiment, although each of the bonding pads in the bridging bonding pad structure 22 may be placed in any region of the integrated circuit chip, e.g. the core circuit region or the I/O region, it is more practical to place bonding pads in either the same or different core circuit regions.

Figure 10C:
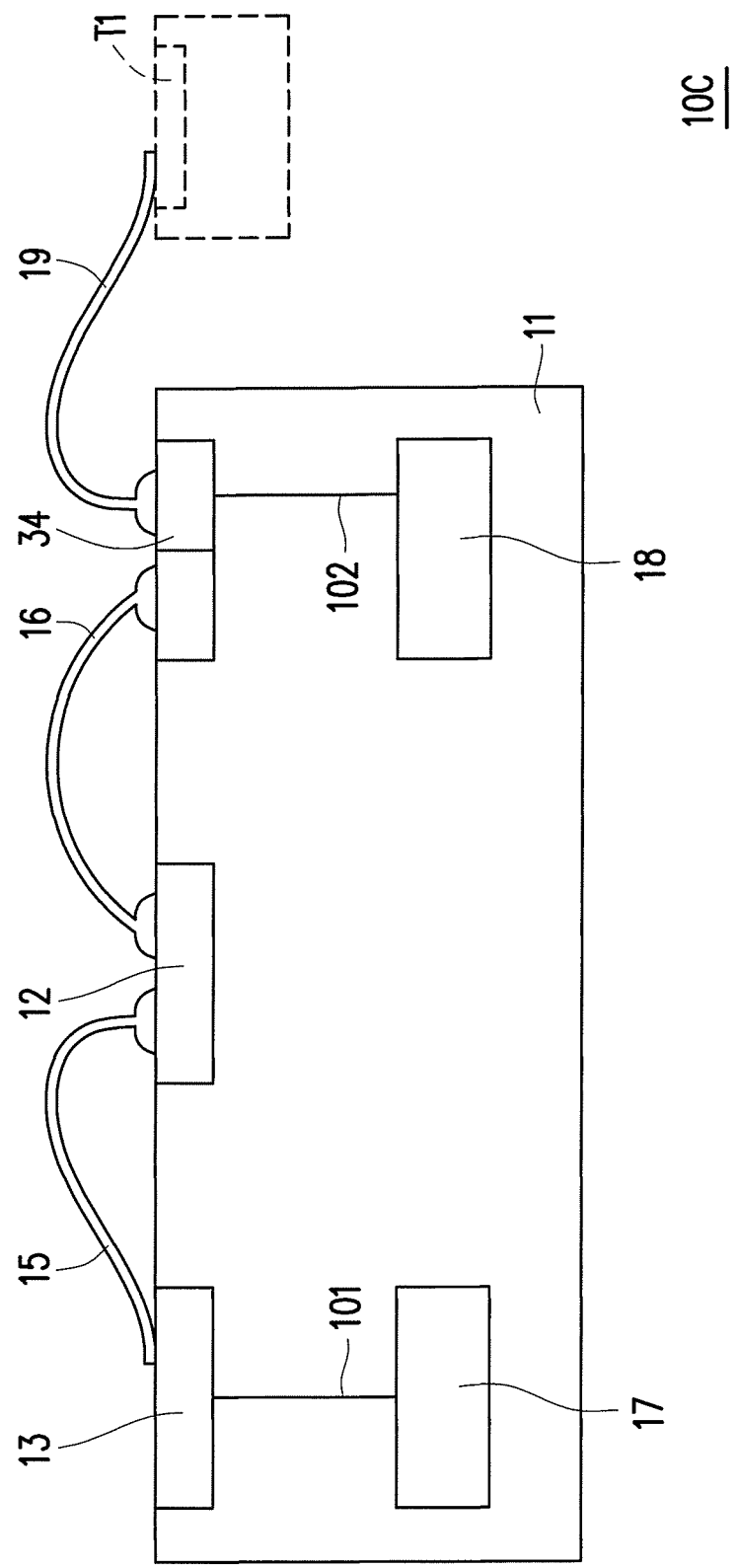

FIG. 10C is a schematic cross-sectional views of an integrated circuit device according to another embodiment of the disclosure. Referring to FIGS. 10A and 10C, the integrated circuit device 10C of the exemplary embodiment is similar to the integrated circuit device 10A as shown in FIG. 10A, and the main difference therebetween, for example, lies in that the external bonding pad structure 34 may include a set of bonding pads as exemplarily shown in FIG. 9B, FIG. 9C or FIG. 9D. That is to say, the integrated circuit device 10C is essentially similar to that as shown in FIG. 10A except that the external bonding pad structure 14 is replaced by the external bonding pad structure 34 including a set of bonding pads. All the features described in FIG. 9B, FIG. 9C or FIG. 9D may apply to the external bonding pad structure 34.

Figure 10D:
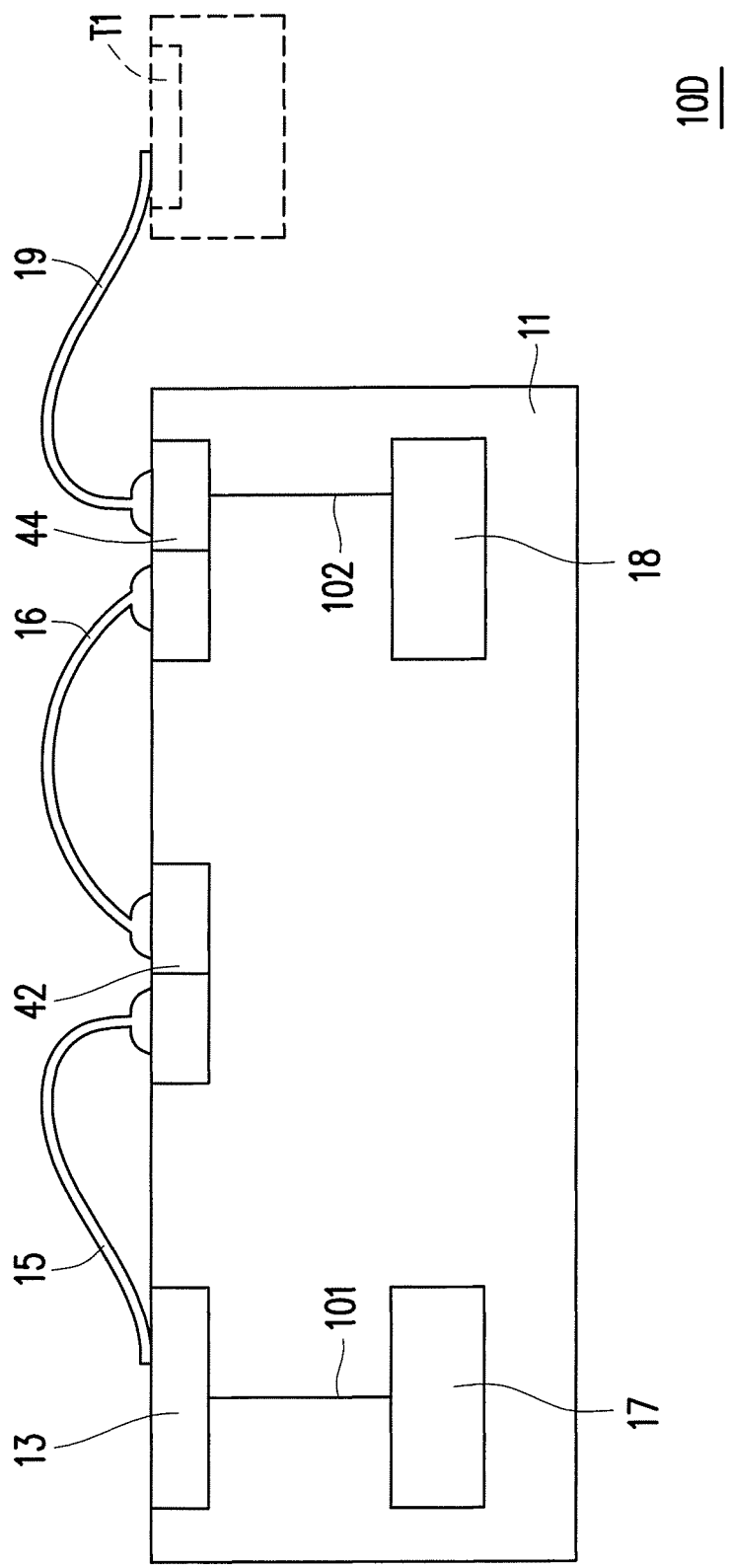
Figure 11:
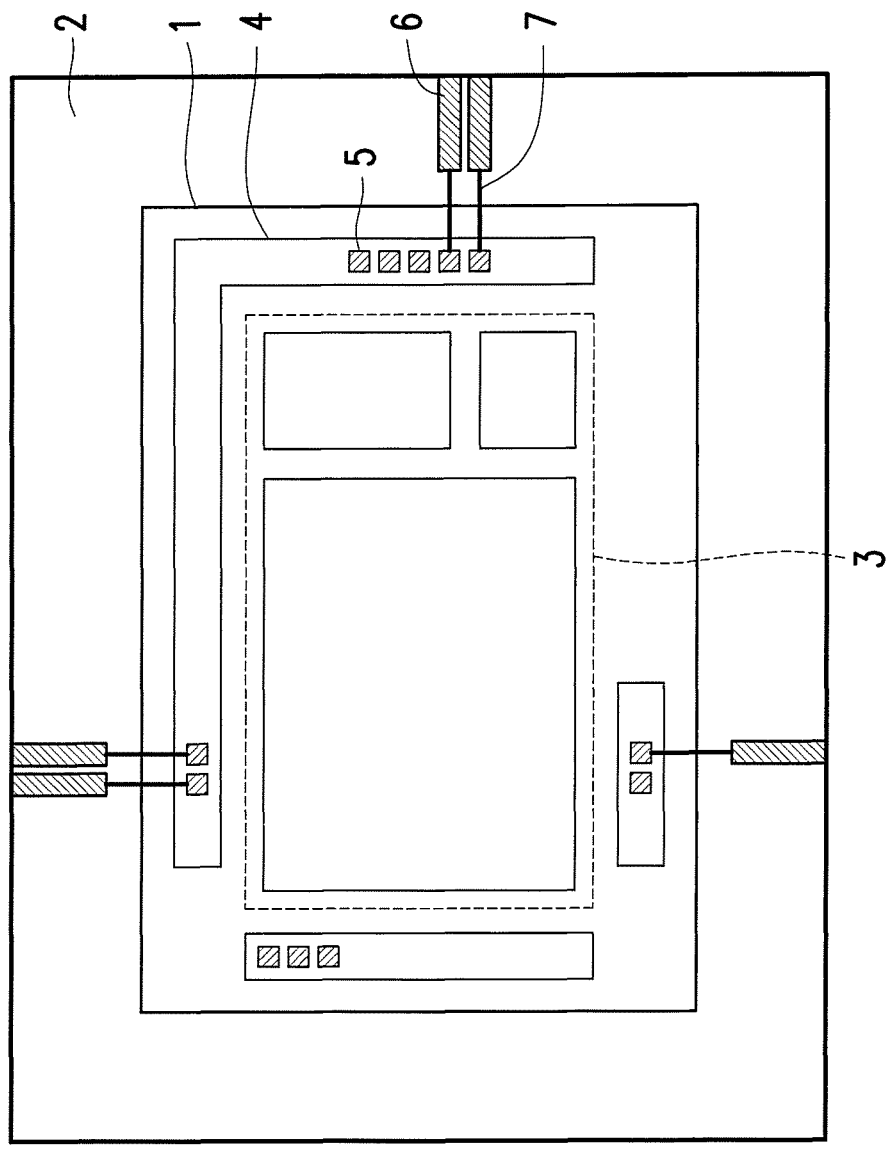
FIG. 11 is a front view of an integrated circuit device according to a related art of the disclosure.

FIG. 10D is a schematic cross-sectional views of an integrated circuit device according to another embodiment of the disclosure. Referring to FIGS. 10A and 10D, the integrated circuit device 10D of the exemplary embodiment is similar to the integrated circuit device 10A as shown in FIG. 10A, and the main difference therebetween, for example, lies in that the bridging bonding pad structure 42 and the external bonding pad structure 44 may respectively include a set of bonding pads as exemplarily shown in FIG. 9B, FIG. 9C or FIG. 9D. That is to say, the integrated circuit device 10D is essentially similar to that shown in FIG. 10A except that both of the bridging bonding pad structure 12 and the external bonding pad structure 14 are respectively replaced by the bridging bonding pad structure 42 and the external bonding pad structure 44 respectively including a set of bonding pads. All the features described in FIG. 9B, FIG. 9C or FIG. 9D may apply to the external bonding pad structure 44, and all the features regarding the bridging bonding pad structure 22 described in FIG. 10B may apply to the bridging bonding pad structure 42 in this case.

Other features of the internal bonding pad structure and the external bonding pad structure are essentially similar to that disclosed in FIG. 2 to FIG. 9D, and are sufficiently taught, suggested, and embodied in the embodiments illustrated in FIG. 2 to FIG. 9D. Therefore, no further description is provided herein.

In light of the foregoing, in the integrated circuit device of disclosure, the internal bonding pad structure and bonding wire are used to obtain electrical coupling between the internal circuits. The wire bonding may provide a better electrical performance by eliminating IR-drop in power supply trails or ground trails, and improving signal integrity of the integrated circuit device. Moreover, less design restriction may be obtained and the time of design may also be reduced. Furthermore, the cost is decreased since the number of metal layers for forming the interconnect lines may be reduced. In addition, in the integrated circuit device of disclosure, since the electrostatic discharge protection circuit exists between the external bonding pad structure and the internal circuits, the damage of the internal circuits due to electrostatic discharge may be avoided. The disclosure also provides an easy way of building conduction paths among circuitry of the integrated circuit device, particularly for a very large scale integrated circuit device of high circuit complexity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An integrated circuit device, comprising:
a semiconductor substrate;
a first bonding pad structure, disposed on a surface of the semiconductor substrate and exposed outside of the semiconductor substrate;
a second bonding pad structure, disposed on the surface of the semiconductor substrate and exposed outside of the semiconductor substrate; and
an internal bonding wire, wherein the first bonding pad structure is electrically coupled to the second bonding pad structure via the internal bonding wire.

2. The integrated circuit device as claimed in claim 1, further comprising:
an external bonding wire, wherein the second bonding pad structure is electrically coupled to a package lead via the external bonding wire.

3. The integrated circuit device as claimed in claim 2, wherein the second bonding pad structure comprises a single bonding pad, and the single bonding pad comprises:
a first bonding area, configured to establish the internal bonding wire between the second bonding pad structure and the first bonding pad structure; and
a second bonding area, electrically coupled to the first bonding area, and configured to establish the external bonding wire between the second bonding pad structure and the package lead.

4. The integrated circuit device as claimed in claim 3, wherein the first bonding area and the second bonding area are located in a same pad opening of the second bonding pad structure.

5. The integrated circuit device as claimed in claim 3, wherein the first bonding area and the second bonding area are respectively located in different pad openings of the second bonding pad structure.

6. The integrated circuit device as claimed in claim 2, wherein the semiconductor substrate comprises an I/O region and a core circuit region, and the second bonding pad structure comprises:
a conducting line;
a first bonding pad, configured to establish the internal bonding wire between the second bonding pad structure and the first bonding pad structure; and
a second bonding pad, electrically coupled to the first bonding pad via the conducting line, and configured to establish the external bonding wire between the second bonding pad structure and the package lead.

7. The integrated circuit device as claimed in claim 6, wherein the first bonding pad and the second bonding pad are adjacent to each other.

8. The integrated circuit device as claimed in claim 6, wherein the second bonding pad structure further comprises at least one third bonding pad located between the first bonding pad and the second bonding pad.

9. The integrated circuit device as claimed in claim 6, wherein the first bonding pad is located in one of the I/O region and the core circuit region, and the second bonding pad is located in another one of the I/O region and the core circuit region.

10. The integrated circuit device as claimed in claim 6, wherein both of the first bonding pad and the second bonding pad are located in one of the I/O region and the core circuit region.

11. The integrated circuit device as claimed in claim 1, wherein the semiconductor substrate comprises an I/O region and a core circuit region, the first bonding pad structure is located in one of the I/O region and the core circuit region, and the second bonding pad structure is located in another one of the I/O region and the core circuit region.

12. The integrated circuit device as claimed in claim 1, further comprising a circuit electrically coupled to the first bonding pad structure.

13. The integrated circuit device as claimed in claim 12, wherein a power voltage applied to the circuit is transmitted from the second bonding pad structure to the circuit via the internal bonding wire and the first bonding pad structure.

14. The integrated circuit device as claimed in claim 13, wherein the power voltage is selected from one of a ground voltage, a first power voltage, and a second power voltage, and the first power voltage having a voltage level greater than the ground voltage, and the second power voltage having a voltage level less than the ground voltage.

15. The integrated circuit device as claimed in claim 12, wherein a signal coupled to the circuit is transmitted between the circuit and the second bonding pad structure via the internal bonding wire and the first bonding pad structure.

16. The integrated circuit device as claimed in claim 1, further comprising:
   an electrostatic discharge protection circuit electrically coupled to the second bonding pad structure.

\* \* \* \* \*